(12) United States Patent
Liu et al.

(10) Patent No.: US 11,586,112 B2
(45) Date of Patent: Feb. 21, 2023

(54) METHOD TO ACHIEVE TILTED PATTERNING WITH A THROUGH RESIST THICKNESS

(71) Applicant: Intel Corporation, Santa Clara, CA (US)

(72) Inventors: Changhua Liu, Chandler, AZ (US); Allan Ketelsen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1035 days.

(21) Appl. No.: 16/111,056

(22) Filed: Aug. 23, 2018

(65) Prior Publication Data

US 2020/0064738 A1 Feb. 27, 2020

(51) Int. Cl.
*G03F 7/20* (2006.01)
*H01L 21/027* (2006.01)
*G02B 5/04* (2006.01)

(52) U.S. Cl.
CPC .......... *G03F 7/201* (2013.01); *G02B 5/04* (2013.01); *G03F 7/203* (2013.01); *G03F 7/7035* (2013.01); *G03F 7/70191* (2013.01); *G03F 7/70375* (2013.01); *H01L 21/0273* (2013.01)

(58) Field of Classification Search
CPC .......... G03F 7/7035; G03F 7/70191; G03F 7/70283; G03F 1/50; G03F 7/201; G03F 7/203; G03F 7/70375; G02B 5/04; H01L 21/0274; H01L 21/0272; H01L 21/32139; H01L 24/13; H01L 24/16; H01L 24/48; H01L 2223/54426; H01L 2224/16227; H01L 2224/48227; H01L 2924/15311; H01L 23/544; H01L 21/0273
See application file for complete search history.

(56) References Cited

U.S. PATENT DOCUMENTS

2009/0067072 A1* 3/2009 Kao ............... G03B 21/008 359/834
2012/0013876 A1* 1/2012 Kim ............... G03F 7/70058 355/77

* cited by examiner

*Primary Examiner* — Mesfin T Asfaw
(74) *Attorney, Agent, or Firm* — Schwabe, Williamson & Wyatt, P.C.

(57) ABSTRACT

Embodiments disclosed herein include a lithographic patterning system and methods of using such a system to form a microelectronic device. In an embodiment, the lithographic patterning system includes an actinic radiation source, a stage where a major surface of the stage is for supporting a substrate with a resist layer, and a first prism over the stage, where the first prism comprises a first face that is substantially parallel to the major surface of the stage. In an embodiment, the lithographic patterning system further comprises a second prism, where the second prism comprises a first surface that is substantially parallel to a second surface of the first prism, and where a second surface of the second prism has a reflective coating.

22 Claims, 7 Drawing Sheets

METHOD TO ACHIEVE TILTED PATTERNING WITH A THROUGH RESIST THICKNESS

TECHNICAL FIELD

Embodiments of the disclosure are in the field of lithographic patterning, and more particularly, to methods and systems for achieving patterns in a resist layer that extend in a direction that is non-perpendicular to a surface of the resist layer.

BACKGROUND

Traditional photolithography assumes a vertical projection of the actinic radiation used to expose a resist layer. As such, the exposure image field is projected into the resist vertically and the resulting features patterned into the resist layer will stand substantially perpendicular to the surface of the resist layer. Devices (e.g., transistor devices, packaging layers, micro-electromechanical systems (MEMS), and the like) designed or fabricated with such vertical projection lithography will have horizontal lines and perpendicular vias.

DESCRIPTION OF THE EMBODIMENTS

Figure 1:
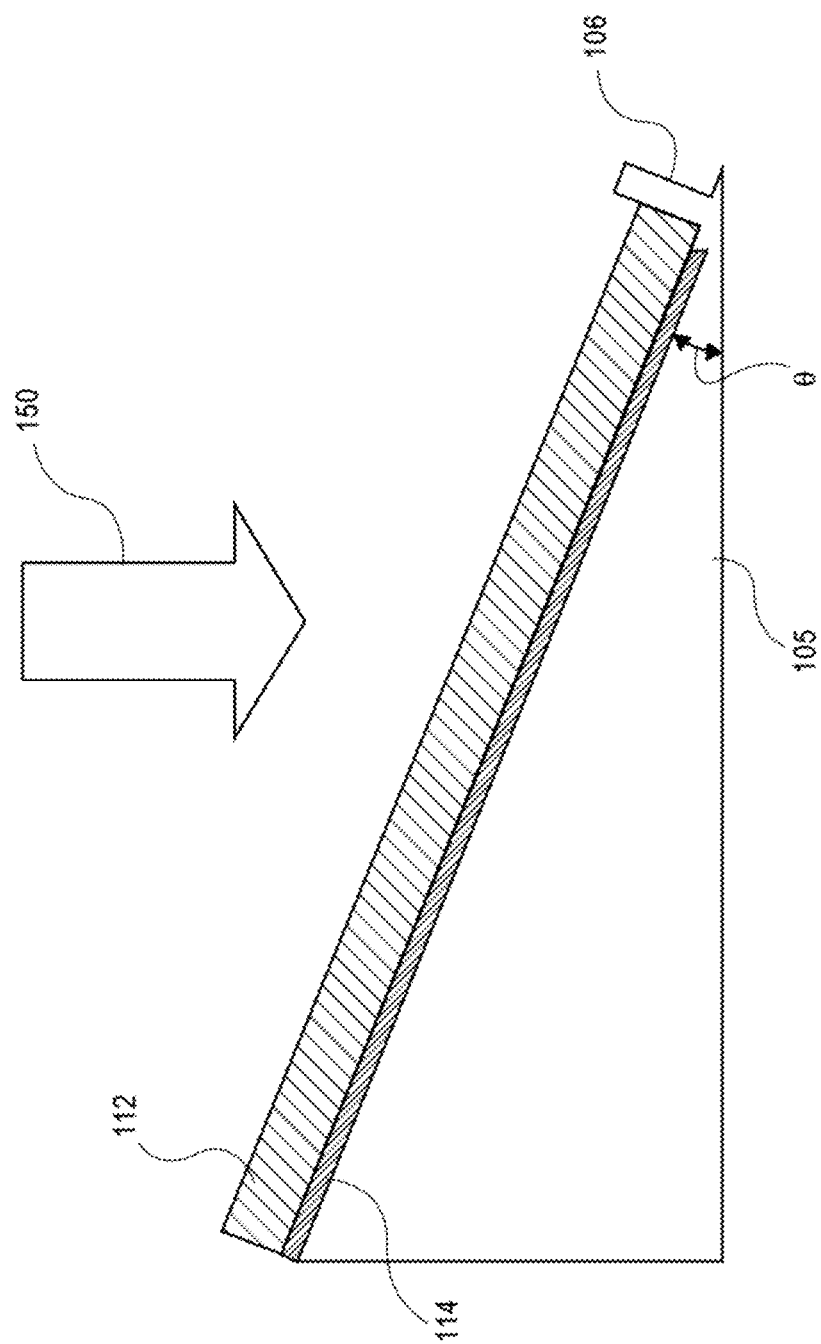
FIG. 1 is a cross-sectional illustration of a vertical projection lithography system with a stage that is at an angle.

Embodiments described herein comprise patterned resist layers that comprise features that extend in a direction non-perpendicular to a surface of the resist layer and methods of forming such resist layers. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently available lithography systems are not able to generate patterned features that extend into the resist layer in directions other than orthogonally. Some attempts have been made to provide, such non-orthogonal patterned features. For example, as shown in FIG. 1, the stage 105 on which a substrate 114 and a mask 112 rest may have a major surface that is tilted at an angle θ. By tilting the substrate 114 at an angle θ, the optical path of incoming actinic radiation 150 is no longer orthogonal to the substrate 114. However, such lithography systems have significant drawbacks.

One drawback is that the actual projected angle inside the resist will be lower than the angle to which stage is tilted due to a higher refractive index of the mask and the resist compared to air. The theoretic upper bound of the angle inside the resist will be the critical angle defined by the refractive index of the resist and air.

A second drawback is that a high percentage of exposure energy is lost due to reflection when the light hits the glass surface at high angles. As defined by Fresnel reflection equations, larger portions of the actinic radiation will be reflected as the incident angle approaches 90°, making it is not practical to achieve the tilt angle inside the resist even before the critical angle is reached. Accordingly, the practical limit of the tilt angle inside the resist is about 25°.

A third issue with the approach illustrated in FIG. 1 is the actual implementation of the tilted stage in a volume manufacturing environment. Particularly, as the tilt angle θ is increased, the tilted stage 105 will need a larger clearance in the Z-direction, so as to be compatible with existing panel process infrastructures. For example, if the stage is tilted an angle θ of 45°, the Z-direction clearance will need to be as much as the substrate length (e.g., the length of a full panel or wafer). In addition, if the substrate 114 is brittle, such as a glass panel substrate, tilting the stage 105 becomes undesirable. For example, as shown in FIG. 1 a tilted stage 105 requires a footing 106 in order to prevent the substrate from slipping. The footing 106 may put a high stress on the panel. This may cause glass to crack, leading to even more complicated stage design requirements.

Accordingly, embodiments disclosed herein include lithography systems that enable off-angle patterning by using a plurality of prisms to change the optical path of actinic radiation instead of relying on a tilted stage. As such, the substrate may rest on a stage that is substantially parallel, and the problems referenced above are mitigated.

Figure 2A:
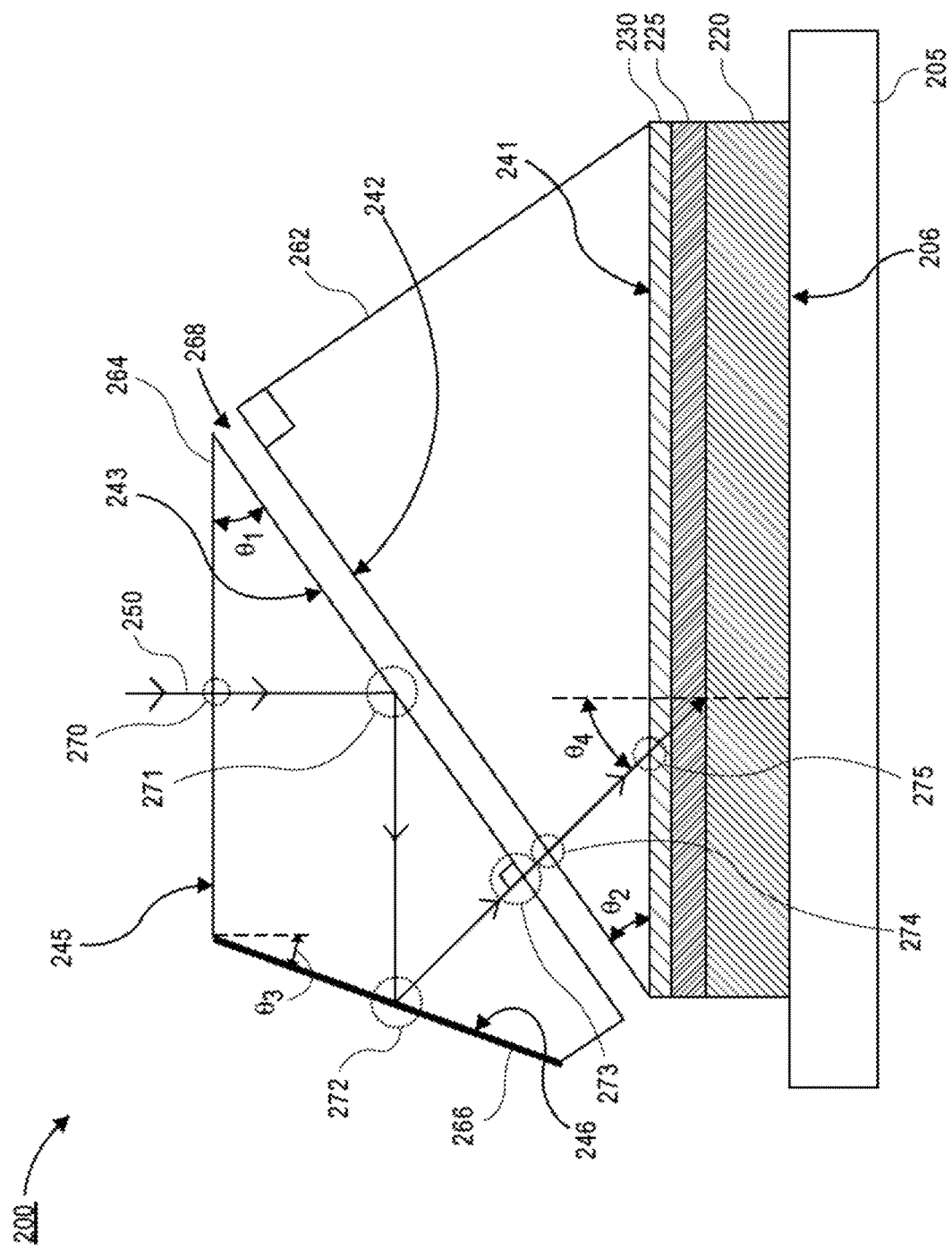
FIG. 2A is a cross-sectional illustration of a lithography system that comprises a first prism and a second prism that enables off-angled patterning of a layer, in accordance with an embodiment.

Referring now to FIG. 2A, a cross-sectional illustration of a lithography system 200 is shown, in accordance with an embodiment. In an embodiment, the lithography system 200 may comprise a stage 205, a first prism 262, and a second prism 264. In an embodiment, the stage 205 may be any suitable stage 205 for supporting a substrate 220 during the lithography process. In an embodiment, the stage 205 may have a major surface 206 that supports the substrate 220. In an embodiment, the major surface 206 may be substantially parallel to the ground. That is, the major surface 206 is not tilted at any significant angle.

In an embodiment, the substrate 220 may be any substrate that is a suitable candidate for lithographic patterning. Since the major surface 206 is not tilted, there is no need to accommodate an increased Z-height. As such, the substrate 220 may be any size. For example, the substrate 220 may be a wafer, a panel, a quarter-panel, or any other size. In an embodiment, the lithography system 200 may be suitable for processing substrates 220 that are used in the fabrication of computing devices (e.g., transistor devices, packaging layers, etc.) and/or for the fabrication of micro-electromechanical systems (MEMS), or the like.

In an embodiment, a resist layer 225 may be deposited over a top surface of the substrate 220. In an embodiment, the resist layer 225 may be a layer of material that undergoes a chemical reaction when exposed to actinic radiation generated by the lithography system 200. In a particular embodiment, the resist layer 225 may be referred to as a photoresist layer. Embodiments include resist layers 225 that are both positive tone and negative tone photoresist layers. While the resist layer 225 in FIG. 2A is shown as covering the entire top surface of the substrate 220, it is to be appreciated that the resist layer 225 may cover only portions of the substrate 220.

In an embodiment, the resist layer 225 may be patterned with the lithography tool 200. That is, actinic radiation from the lithography tool may travel along an optical path 250 that passes through a mask layer 230 and intersects with portions of the resist layer 225 exposed through by the mask layer 230. The actinic radiation may initiate a chemical reaction in the resist layer 225, and the resist layer 225 may be developed (i.e., removal of the reacted portions or the unreacted portions, depending on the tone of the resist) with a developing solution.

As shown in FIG. 2A, the optical path 250 may intersect with the resist layer 225 at a non-orthogonal angle θ4. Accordingly, embodiments include patterned features (not shown in FIG. 2A) that extend into the resist layer 225 in a non-orthogonal direction to a surface of the resist layer 225, as will be described in greater detail below with respect to FIG. 3. In some embodiments, the resist layer 225 may be used to subsequently pattern portions of the underlying substrate 220. That is, the pattern of the resist layer 225 may be transferred into the surface of the substrate 220 and the resist layer 225 may be stripped away. In additional embodiments, the resist layer 225 may be a photoimageable dielectric. In such embodiments, the resist layer 225 may remain in portions of the final device fabricated, in part, with the lithography system 200.

According to an embodiment, the optical path 250 may pass through a first prism 262 and a second prism 264. In an embodiment, the first prism 262 may be a right angle prism. In an embodiment, a first surface 241 (i.e., the surface opposite from the right angle) may be substantially parallel to the major surface 206 of the stage 205. In an embodiment, the second prism 264 may be a half-penta prism. In an embodiment, the second prism 264 may have a first surface 243 that is substantially parallel to a second surface 242 of the first prism 262.

In an embodiment, the first surface 243 of the second prism 264 may be spaced away from the second surface 242 of the first prism 262 by an air gap 268. The presence of an air gap 268 between the surfaces 243 and 242 allows for total internal reflection of the optical path at point 271, as will be described in greater detail below. While referred to herein as an "air gap", it is to be appreciated that the air gap 268 may comprise any fluid constituents including gasses and liquids (e.g., the lithography system 200 may be an immersion lithography system).

In an embodiment, the second prism 264 may have a second surface 245 that intersects with the first surface 243 to form a first angle $\theta_1$. In an embodiment, the second surface 245 may be substantially parallel to the major surface 206 of the stage 205. In an embodiment, the first angle $\theta_1$ may be substantially equal to a second angle $\theta_2$ formed at the intersection of the first surface 241 of the first prism 262 and the second surface 242 of the first prism 262. Choosing the first angle $\theta_1$ to be substantially equal to the second angle $\theta_2$ ensures that reflected actinic radiation will not introduce an unwanted secondary light path.

In an embodiment, the second prism 264 may have a third surface 246 that intersects with the second surface 245 at a third angle $\theta_3$. In an embodiment, the third surface 246 may have a reflective coating 266 that reflects a high percentage of the actinic radiation used in the system. In an embodiment, the third angle $\theta_3$ may be an angle chosen such that the reflected actinic radiation exits second prism 264 at an angle orthogonal to the first surface 243 of the second prism 264. Since the first surface 243 of the second prism 264 is parallel to the second surface 242 of the first prism 262, the optical path 250 enters the first prism 262 at an orthogonal angle to the second surface 242 of the first prism 262 as well. In a particular embodiment, the third angle $\theta_3$ may be approximately one-half the first angle $\theta_1$.

In an embodiment, the first prism 262 and the second prism 264 may be any suitable materials. In an embodiment, the first prism 262 and the second prism 264 may be the same material. That is, in some embodiments, the index of refraction of the first prism 262 substantially matches the index of refraction of the second prism 264. However, it is to be appreciated that other embodiments may include a first prism 262 that has a different refractive index than the second prism 264.

In FIG. 2A, actinic radiation is shown as propagating through the lithography system 200 from an actinic light source (not shown) to the resist layer 225 along an optical path 250. As indicated by the direction of the arrows along the optical path 250, the optical path 250 first enters the second prism 264 at location 270. As shown at location 270, the optical path 250 enters into the second prism 264 by passing through the second surface 245 of the second prism 264. In an embodiment, the optical path 250 may be substantially orthogonal to the second surface 245 of the second prism at location 270. However, embodiments are not limited to such configurations, as will be described in greater detail with respect to FIG. 3.

In an embodiment, the optical path 250 continues by passing through the second prism 264 until the optical path 250 reflects off of the first surface 243 of the second prism 264 at location 271. In an embodiment, the angle of the optical path 250 with respect to the first surface 243 combined with the index of refraction differences between the second prism 264 and the air gap 268 may result in a total internal reflection. That is, even though the first surface 243 of the second prism 264 does not have a reflective coating, the optical path still entirely reflects towards the third surface 246 of the second prism 264.

In an embodiment, the optical path 250 passes again through the second prism 264 until the optical path 250 reflects off of the reflective coating 266 on the third surface 246 of the second prism 264 at location 272. As noted above, substantially all of the actinic radiation traveling along optical path 250 may be reflected by the reflective coating 266. In an embodiment, the optical path 250 passes through the second prism 264 again until the optical path passes through the first surface 243 of the second prism 264 at location 273. As noted above, the third angle $\theta_3$ may be such that the optical path 250 passes through the first surface 243 into the air gap 268 at an orthogonal angle.

In an embodiment, the optical path 250 next passes through the air gap 268 and passes through the second surface 242 of the first prism 262 at location 274. As noted above, since the second surface 242 of the first prism 262 is parallel to the first surface 243 of the second prism 264, the optical path 250 passes through the second surface 242 of the first prism at an orthogonal angle.

In an embodiment, the optical path 250 may then continue through the first prism 262 until it exits along the first surface 241 of the first prism 262 at location 275. In an embodiment, the optical path 250 may exit the first prism 262 at a fourth angle $\theta_4$ with respect to normal. In an embodiment, the fourth angle $\theta_4$ may be substantially the same as the first angle $\theta_1$. After exiting the first prism 262, the optical path 250 may pass through openings (not shown) through the mask layer 230 and intersect with the resist layer 225.

Figure 2B:
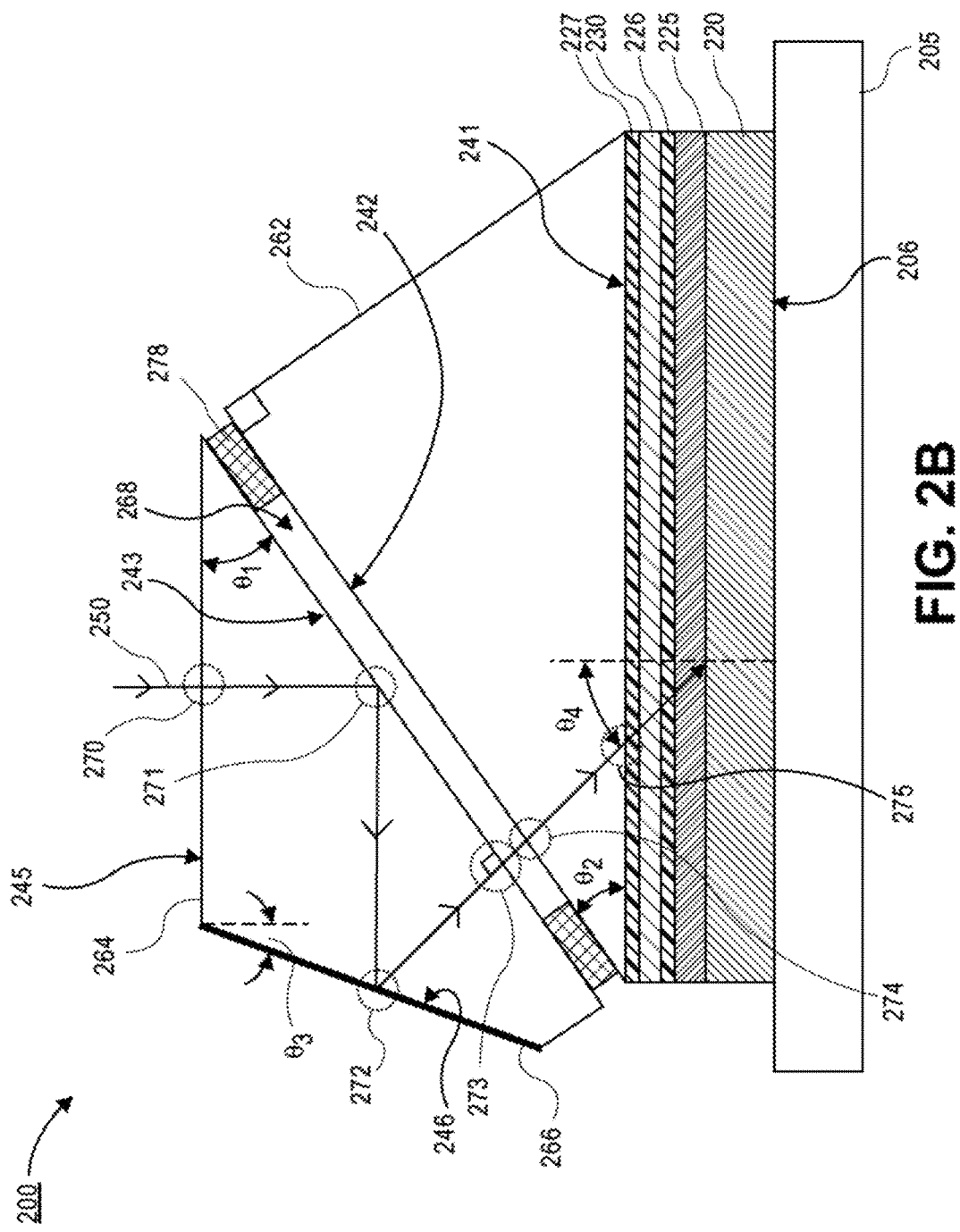
FIG. 2B is a cross-sectional illustration of a lithography system that comprises a first prism, a second prism, and index of refracting matching layers between the mask and one of the prisms, and between the mask and the substrate, in accordance with an embodiment.

Referring now to FIG. 2B, a cross-sectional illustration of a lithography system 200 is shown, in accordance with an additional embodiment. In an embodiment, the lithography system 200 shown in FIG. 2B may be substantially similar to the lithography system 200 shown in FIG. 2A, with the exception that several additional components are added to the system.

In a particular embodiment, the air gap 268 may be maintained by spacers 278. In an embodiment, a plurality of spacers 278 may be used, or a single spacer 278 may be used. While spacers 278 are shown, it is to be appreciated that the air gap 268 may be maintained by any mechanical fixtures that secures the first prism 262 and/or the second prism 264.

In an embodiment, one or more index of refraction matching layers may also be included in the lithography system 200. For example, a first index of refraction matching layer 227 may be formed between the first surface 241 of the first prism 262 and the mask layer 230. In an embodiment, the first index of refraction matching layer 227 may have an index of refraction that is substantially equal to the index of refraction of the first prism 262. Accordingly, when actinic radiation exits the first prism 262 along optical path 250, the angle of the optical path will not substantially change. In an additional embodiment, a second index of refraction matching layer 226 may be positioned between the mask layer 230 and the resist layer 225. In an embodiment, the second index of refraction matching layer 226 may also be used to ensure that the angle of the optical path 250 does not change after the optical path passes through the mask layer 230.

Since the stage 205 is not tilted, the first and second index of refraction matching layers 226 may be any suitable materials, including low viscosity materials. Whereas a low viscosity material, such as water, cannot be used on a tilted stage since gravity will prevent the layer from staying in place, a non-tilted stage 205 allows for low viscosity materials to be used for the index of refraction matching layers 226 and 227. In an embodiment, the index of refraction matching layers 226 and 227 may be the same material. In other embodiments, the index of refraction matching layers 226 and 227 may be different materials. In an embodiment, the index of refraction matching layers 226 and 227 may comprise, gels, liquids, or any other suitable material layer.

In FIGS. 2A and 2B, the first angle $\theta_1$ is illustrated as being approximately 45°. Accordingly, the optical path 250 may intersect the resist layer at a fourth angle $\theta_4$ that is also approximately 45°. However, embodiments are not limited to such configurations. For example, the first angle $\theta_1$ and the second angle $\theta_2$ may be increased in order to increase the fourth angle $\theta_4$. In order to decrease the patterning angle $\theta_4$ (i.e., to make the patterning angle closer to orthogonal), the first angle $\theta_1$ and the second angle $\theta_2$ may be decreased. However, there is a practical limit on how much the first angle $\theta_1$ can be reduced since the first reflection at location 271 requires a total internal refraction. With a high index of refraction material (e.g., an index of refraction of approximately 1.75), the first angle $\theta_1$ may be set as low as approximately 35°. However, it is to be appreciated that embodiments are not limited to such angles. For example, additional changes to the geometry of the second prism 264 may be made in order to obtain even lower patterning angles $\theta_4$. An example of such an embodiment is shown with respect to FIG. 2C.

Figure 2C:
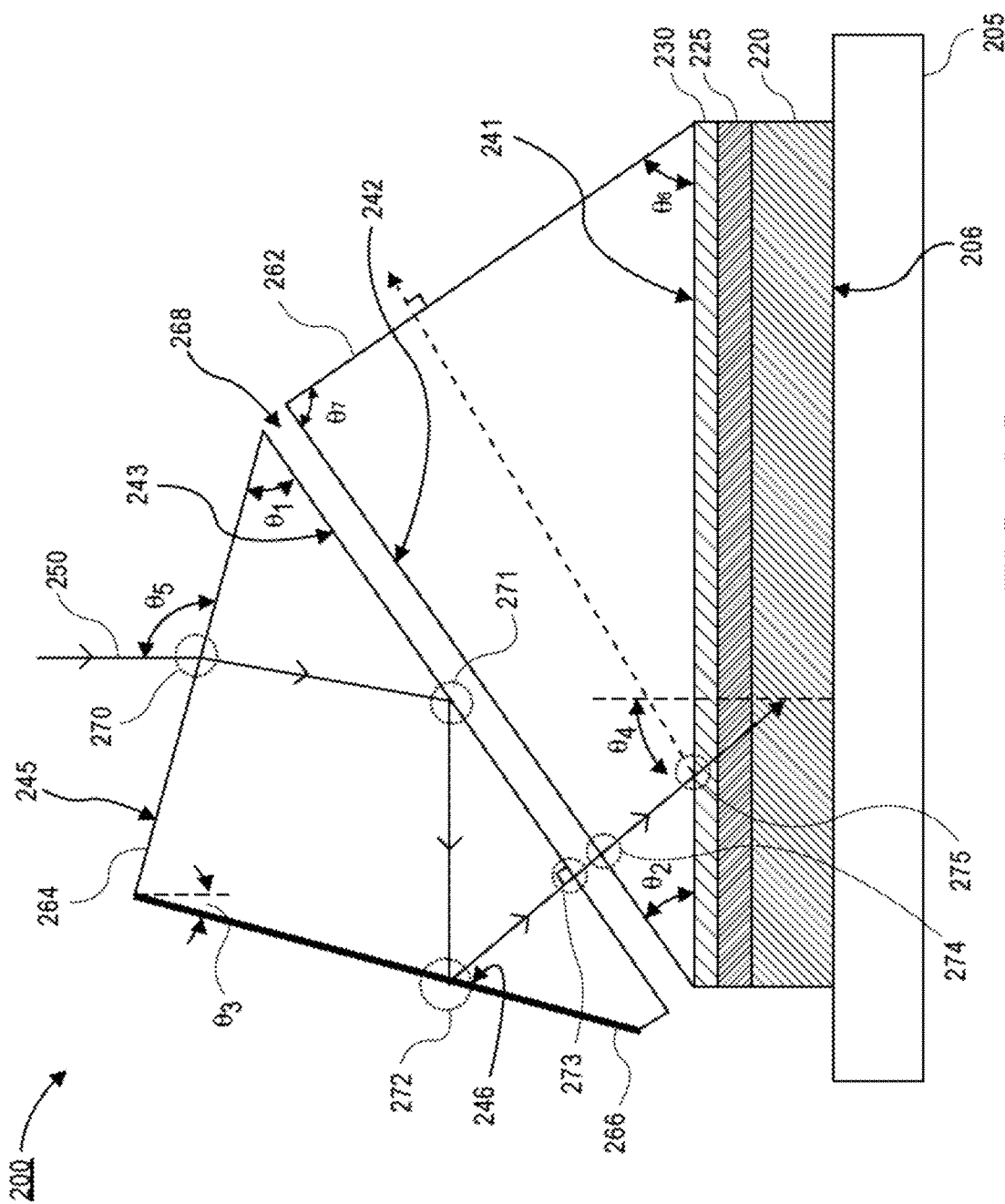
FIG. 2C is a cross-sectional illustration of a lithography system that comprises a first prism and a second prism, where an optical path enters one of the prisms at a non-orthogonal angle, in accordance with an embodiment.

Referring now to FIG. 2C, a cross-sectional illustration of a lithography system 200 is shown, in accordance with an embodiment. In an embodiment, lithography system 200 may be substantially similar to the lithography system 200 described with respect to FIG. 2A, with the exception that the second surface 245 of the second prism 264 is not parallel to the major surface 206 of the stage 205. In an embodiment, the optical path 250 may intersect the second surface 245 at a non-orthogonal angle $\theta 5$ at location 270. Since the optical path 250 is not at an orthogonal angle with respect to the second surface 245 of the second prism 264, the optical path bends due to differences in the index of refraction between the atmosphere and the second prism 264. Accordingly, a less aggressive incidence angle between the optical path 250 and the first surface 243 of the second prism 264 at location 271 may be obtained in order to provide a total internal reflection even with lower refractive index materials. In an embodiment, the deviation of the light path may then be corrected by a slight shift of the third surface 246 of the second prism 264 to ensure that the optical path 250 exits the second prism 264 at location 273 at an angle orthogonal to the first surface 243 of the second prism 264. As those skilled in the art will appreciate, the precise angles needed for each face of the second prism 264 may be obtained by calculations based on geometry and the use of Snell's law.

As shown in FIG. 2C, the first prism 262 may also be modified to provide minimize (or eliminate) the presence of a secondary light path due to reflected light. In an embodiment, the first prism 262 may have an angle $\theta_6$ that matches the angle $\theta_2$. To account for matching of angle $\theta_6$ to $\theta_2$, the first prism 262 may not always be a right angle prism. For example, angle $\theta 7$ may not be 90° in some embodiments. Matching angle $\theta_6$ to $\theta_2$ ensures that reflected light (as indicated by the dashed line) exits the first prism at a right angle, thereby preventing any unwanted reflection back towards the substrate 220.

Figure 3:
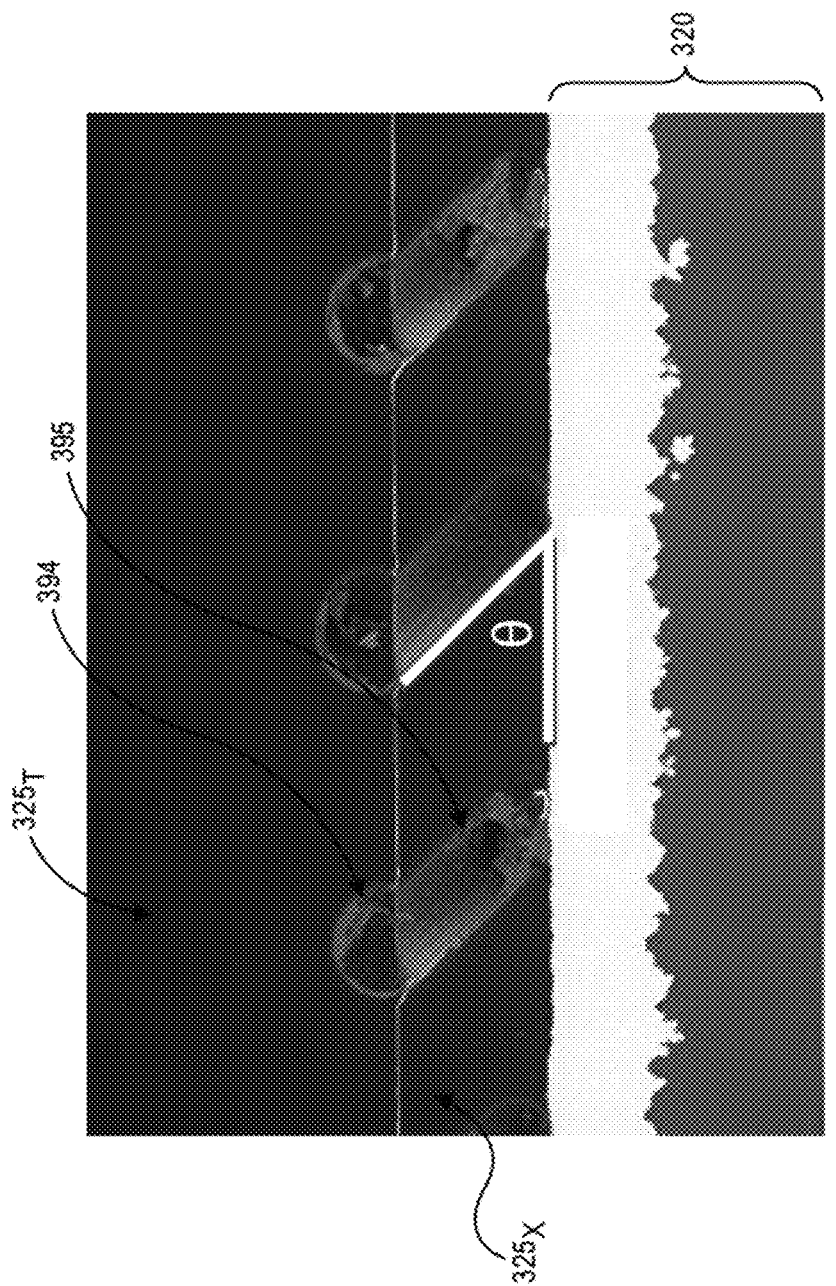
FIG. 3 is a cross-sectional illustration of a layer over a substrate that is patterned with a lithography system such as those described herein, in accordance with an embodiment.

Referring now to FIG. 3, a perspective view of a patterned resist layer 325 is shown, in accordance with an embodiment. In the illustrated embodiment, a top surface 325T and a cross-sectional surface 325x are shown. In an embodiment, the resist layer 325 may be formed over a substrate 320.

As shown along the top surface 325T, a plurality of holes 394 are formed. It is to be appreciated that the holes 394 may be any desired shape or dimension attainable by the lithographic system. Additionally, while holes 394 are shown, it is to be appreciated that lines or any other feature may be patterned into the resist layer 325. As shown in the cross-sectional portion of the resist layer 325x, the holes 394 extend down through the resist layer 325 at an angle θ. That is, the sidewalls 395 of the holes 394 are at an angle θ with respect to a major surface of the substrate 320. In an embodiment, the angle θ may be a non-orthogonal angle. For example, the angle θ may be less than 90°, less than 45°, or less than 30°. In a particular embodiment, the angle θ may be between 20° and 90°.

In some embodiments, the patterned resist layer 325 may be used as a mask to selectively deposit a layer over the underlying substrate 320. That is, a material may be deposited into the openings in the patterned resist layer 325 and the resist layer 325 may subsequently be stripped away to leave a layer with non-vertical features. In additional embodiments, the resist layer 325 may be a photoimageable dielectric. In such embodiments, the resist layer 325 may remain in portions of the final device fabricated, in part, with a lithography system, such as the lithography systems 200 described above.

Figure 4:
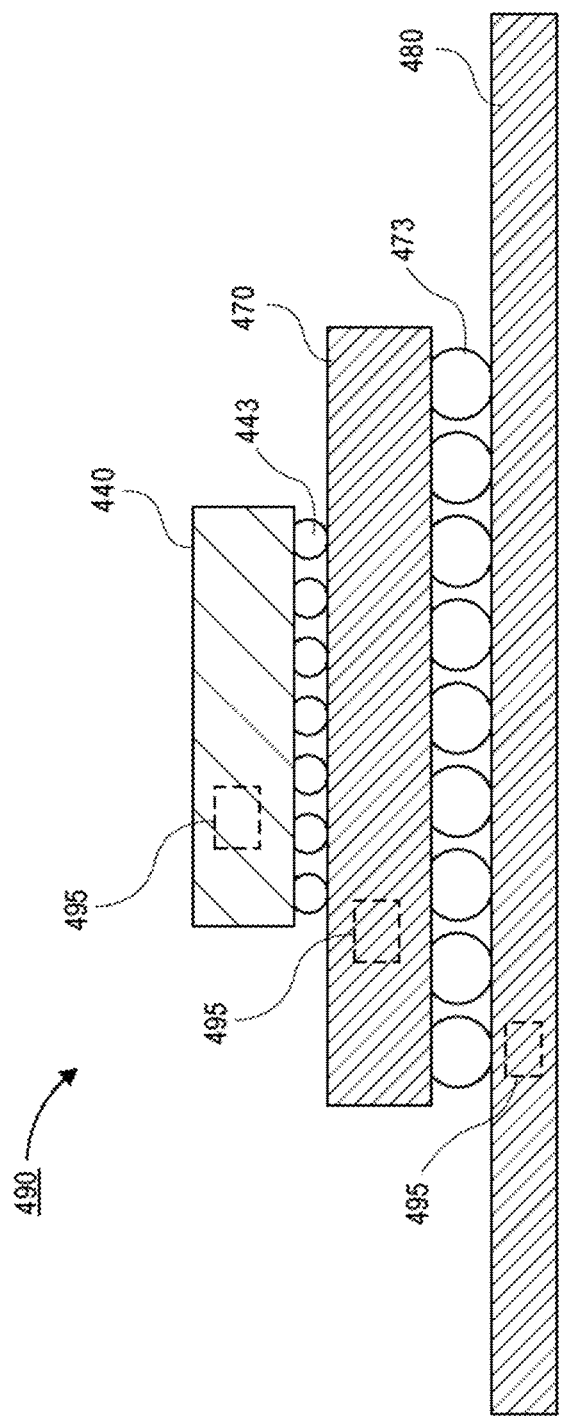
FIG. 4 is a cross-sectional illustration of an electronic package that includes a non-vertical structures, in accordance with an embodiment.

Referring now to FIG. 4, a cross-sectional illustration of a packaged system 490 is shown, in accordance with an embodiment. In an embodiment, the packaged system 490 may include a die 440 electrically coupled to a package substrate 470 with solder bumps 443. In additional embodiments, the die 440 may be electrically coupled to the package substrate 470 with any suitable interconnect architecture, such as wire bonding or the like. The package substrate 470 may be electrically coupled to a board 480, such as a printed circuit board (PCB) with solder bumps 473 or any other suitable interconnect architecture, such as wire bonding or the like.

In an embodiment, features 495 patterned at a non-orthogonal angle similar to embodiments described above may be integrated into the die 440, the package substrate 470 and/or the board 480. Embodiments include any number of features 495 patterned at a non-orthogonal angle formed into the die 440, the package substrate 470 and/or the board 480. For example, a plurality of features 495 patterned at a non-orthogonal angle may be integrated into the circuitry of the die 440, the package substrate 470 and/or the board 480 for any other desired use.

Figure 5:
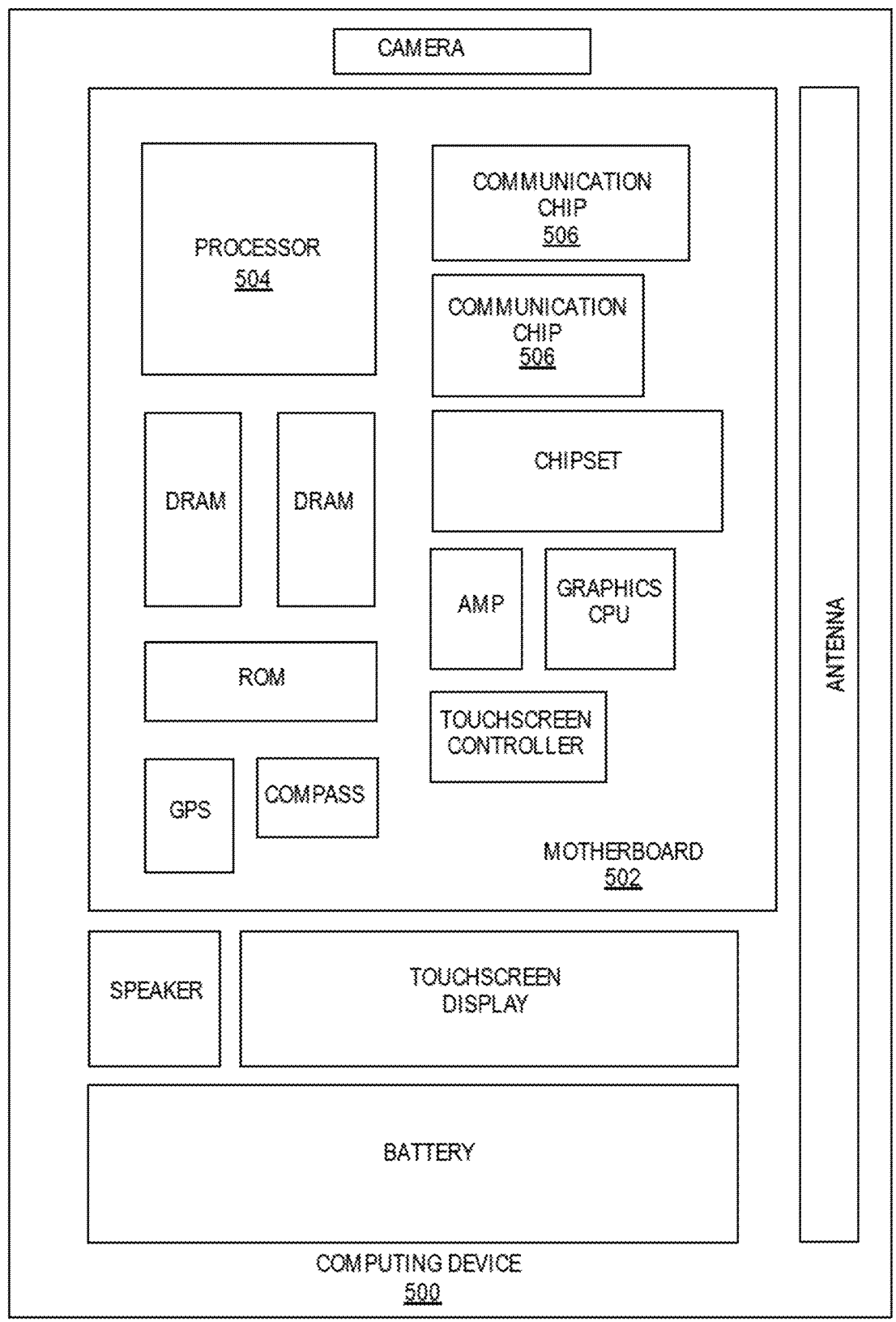
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be communicatively coupled to a device with features patterned at a non-orthogonal angle, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be communicatively coupled to a device with features patterned at a non-orthogonal angle, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a lithographic patterning system, comprising: an actinic radiation source; a stage, wherein a major surface of the stage is for supporting a substrate with a resist layer; a first prism over the stage, wherein the first prism comprises a first face that is substantially parallel to the major surface of the stage; and a second prism, wherein the second prism comprises a first surface that is substantially parallel to a second surface of the first prism, and wherein a second surface of the second prism has a reflective coating.

Example 2: the lithographic patterning system of Example 1, wherein the first surface of the second prism is separated from the second surface of the first prism by an air gap.

Example 3: the lithographic patterning system of Example 1 or Example 2, further comprising: a spacer between the first prism and the second prism.

Example 4: the lithographic patterning system of Examples 1-3, wherein the second prism is a half-penta prism.

Example 5: the lithographic patterning system of Examples 1-4, wherein the first prism and the second prism are formed with the same material.

Example 6: the lithographic patterning system of Examples 1-5, wherein the second prism has a third surface that is parallel to the major surface of the stage.

Example 7: the lithographic patterning system of Examples 1-6, wherein the first surface and the third surface of the second prism intersect to form a first angle.

Example 8: the lithographic patterning system of Examples 1-7, wherein an optical path through the lithographic patterning system exits the first surface of the first prism at the first angle.

Example 9: the lithographic patterning system of Examples 1-8, wherein the first angle is 45°.

Example 10: the lithographic patterning system of Examples 1-9, wherein the second prism has a third surface that is not parallel to the major surface of the stage.

Example 11: the lithographic patterning system of Examples 1-10, further comprising: a mask between the first surface of the first prism and the major surface of the stage.

Example 12: the lithographic patterning system of Examples 1-11, further comprising: a first layer between the first prism and the mask.

Example 13: the lithographic patterning system of Examples 1-12, wherein the first layer has an index of refraction that matches an index of refraction of the first prism.

Example 14: the lithographic patterning system of Examples 1-13, further comprising: a second layer between the mask and the major surface of the stage.

Example 15: the lithographic patterning system of Examples 1-14, wherein the second layer comprises an index of refraction that matches the index of refraction of the first prism.

Example 16: the lithographic patterning system of Examples 1-15, wherein at least one of the first layer and the second layer is a high viscosity material.

Example 17: the lithographic patterning system of Examples 1-16, wherein the second layer is water.

Example 18: a microelectronic device, comprising: a substrate; a patterned layer over the substrate, wherein the patterned layer comprises: a major surface; a plurality of patterned features over the major surface, wherein the patterned features extend out from the major surface at a non-orthogonal angle with respect to the major surface.

Example 19: the microelectronic device of Example 18, wherein the patterned layer is a resist layer.

Example 20: the microelectronic device of Example 18 or Example 19, wherein the patterned features are filled with a material deposited with a deposition process.

Example 21: the microelectronic device of Examples 18-20, wherein the patterned layer is a photoimageable dielectric.

Example 22: the microelectronic device of Examples 18-21, wherein the non-orthogonal angle is between 20° and 90°.

Example 23: the microelectronic device of Examples 18-22, wherein the non-orthogonal angle is 45°.

Example 24: a method of patterning a layer with actinic radiation, comprising: placing a substrate on a stage; placing a mask over the substrate; bringing a first prism and a second prism into an optical path between an actinic light source and the substrate, wherein the first prism is a right angle prism and the second prism is a half-penta prism, and wherein an air gap is formed between first prism and the second prism; and exposing the substrate with actinic radiation from the light source, wherein the actinic radiation follows the optical path, and wherein optical path intersects the substrate at a non-orthogonal angle.

Example 25: the method of Example 24, wherein the non-orthogonal angle is between 20° and 90°.

What is claimed is:

1. A lithographic patterning system, comprising:
   an actinic radiation source;
   a stage, wherein a major surface of the stage is for supporting a substrate with a resist layer;
   a first prism over the stage, wherein the first prism comprises a first face that is substantially parallel to the major surface of the stage; and
   a second prism, wherein the second prism comprises a first surface that is substantially parallel to a second surface of the first prism, wherein a second surface of the second prism has a reflective coating, and wherein the second prism is a half-penta prism.

2. The lithographic patterning system of claim 1, wherein the first surface of the second prism is separated from the second surface of the first prism by an air gap.

3. The lithographic patterning system of claim 2, further comprising:
   a spacer between the first prism and the second prism.

4. The lithographic patterning system of claim 1, wherein the first prism and the second prism are formed with the same material.

5. The lithographic patterning system of claim 1, wherein the second prism has a third surface that is parallel to the major surface of the stage.

6. The lithographic patterning system of claim 5, wherein the first surface and the third surface of the second prism intersect to form a first angle.

7. The lithographic patterning system of claim 6, wherein an optical path through the lithographic patterning system exits the first surface of the first prism at the first angle.

8. The lithographic patterning system of claim 7, wherein the first angle is 45°.

9. The lithographic patterning system of claim 1, wherein the second prism has a third surface that is not parallel to the major surface of the stage.

10. The lithographic patterning system of claim 1, further comprising:
    a mask between the first surface of the first prism and the major surface of the stage.

11. The lithographic patterning system of claim 10, further comprising:
    a first layer between the first prism and the mask.

12. The lithographic patterning system of claim 11, wherein the first layer has an index of refraction that matches an index of refraction of the first prism.

13. The lithographic patterning system of claim 12, further comprising:
    a second layer between the mask and the major surface of the stage.

14. The lithographic patterning system of claim 13, wherein the second layer comprises an index of refraction that matches the index of refraction of the first prism.

15. The lithographic patterning system of claim 14, wherein at least one of the first layer and the second layer is a high viscosity material.

16. The lithographic patterning system of claim 15, wherein the second layer is water.

17. A lithographic patterning system, comprising:
- an actinic radiation source;
- a stage, wherein a major surface of the stage is for supporting a substrate with a resist layer;
- a first prism over the stage, wherein the first prism comprises a first face that is substantially parallel to the major surface of the stage;
- a second prism, wherein the second prism comprises a first surface that is substantially parallel to a second surface of the first prism, and wherein a second surface of the second prism has a reflective coating;
- a mask between the first surface of the first prism and the major surface of the stage; and
- a first layer between the first prism and the mask.

18. The lithographic patterning system of claim 17, wherein the first layer has an index of refraction that matches an index of refraction of the first prism.

19. The lithographic patterning system of claim 18, further comprising:
- a second layer between the mask and the major surface of the stage.

20. The lithographic patterning system of claim 19, wherein the second layer comprises an index of refraction that matches the index of refraction of the first prism.

21. The lithographic patterning system of claim 20, wherein at least one of the first layer and the second layer is a high viscosity material.

22. The lithographic patterning system of claim 21, wherein the second layer is water.

* * * * *